(12) United States Patent
Kim (10) Patent No.: US 12,470,206 B2
(45) Date of Patent: Nov. 11, 2025

(54) DIFFERENTIAL CHOPPER COMPARATOR CAPABLE OF REMOVING KICKBACK NOISE

(71) Applicant: SAMSUNG ELECTRONICS CO., LTD., Suwon-si (KR)

(72) Inventor: Hyochang Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/493,417

(22) Filed: Oct. 24, 2023

(65) Prior Publication Data

US 2024/0333271 A1 Oct. 3, 2024

(30) Foreign Application Priority Data

Mar. 31, 2023 (KR) .......................... 10-2023-0042902

(51) Int. Cl.
*H03K 5/00* (2006.01)
*H03F 1/26* (2006.01)
(Continued)

(52) U.S. Cl.
CPC ............... *H03K 5/02* (2013.01); *H03F 1/26* (2013.01); *H03F 3/45968* (2013.01); *H03K 3/0233* (2013.01); *H03K 5/082* (2013.01)

(58) Field of Classification Search
CPC ........ H03K 5/02; H03K 3/0233; H03K 5/082; H03K 5/249; H03K 5/2427; H03K 5/2454; H03F 1/26; H03F 3/45968
See application file for complete search history.

(56) References Cited

U.S. PATENT DOCUMENTS 5,032,744 A 7/1991 Wai
5,262,686 A * 11/1993 Kurosawa .............. H03K 5/249
341/162
(Continued)

FOREIGN PATENT DOCUMENTS

CN 114759911 A 7/2022

OTHER PUBLICATIONS

Tsukamoto, et al., "A CMOS 6-b, 200 MSample/s, 3 V-Supply A/D Converter for a PRML Read Channel LSI", in IEEE Journal of Solid-State Circuits, vol. 31, No. 11, Nov. 1996, pp. 1831-1836.
(Continued)

*Primary Examiner* — Tuan T Lam
(74) *Attorney, Agent, or Firm* — MORGAN, LEWIS & BOCKIUS LLP (57) ABSTRACT

Disclosed is a differential chopper comparator, which includes an input terminal circuit that receives a first input signal and a second input signal and selectively switches the first and second input signals to intermediate circuit, at least one chopper circuit that generates a first amplified signal and a second amplified signal by amplifying a difference between the first and second input signals at the intermediate circuit points, a comparison circuit that compares the first amplified signal with the second amplified signal, digitizes the comparison result, and outputs a digital signal at a logic level, and a compensation circuit that offsets the first amplified signal and the second amplified signal and thereby removes kickback noise induced in the input terminal circuit. The differential chopper comparator of the present disclosure may shorten the settling time and may operate at high speed.

20 Claims, 8 Drawing Sheets

(51) Int. Cl.
    *H03F 3/45*     (2006.01)
    *H03K 3/0233*     (2006.01)
    *H03K 5/02*     (2006.01)
    *H03K 5/08*     (2006.01)

(56) References Cited

U.S. PATENT DOCUMENTS

| | | | |
|---|---|---|---|
| 5,936,434 | A | 8/1999 | Kumamoto et al. |
| 6,608,503 | B2 * | 8/2003 | Shenai ............... H03K 5/249 |
| | | | 327/337 |
| 6,727,486 | B2 | 4/2004 | Choi |
| 7,145,494 | B2 | 12/2006 | Mizuguchi et al. |
| 7,262,654 | B2 * | 8/2007 | Kejariwal ............... H03F 3/387 |
| | | | 330/9 |
| 7,511,549 | B1 * | 3/2009 | Luo ............... H03K 5/249 |
| | | | 327/337 |
| 8,330,537 | B1 | 12/2012 | Ghorpade et al. |
| 9,525,426 | B2 * | 12/2016 | Stojanovic ............ H03M 3/458 |
| 11,211,922 | B2 | 12/2021 | Tsuji |
| 11,988,986 | B2 * | 5/2024 | Kidoura ............. G03G 15/6582 |
| 2002/0118289 | A1 | 8/2002 | Choi |
| 2003/0038656 | A1 | 2/2003 | Shenai et al. |
| 2006/0001750 | A1 | 1/2006 | Mizuguchi et al. |
| 2013/0050003 | A1 * | 2/2013 | Wang ............... H03M 3/342 |
| | | | 341/172 |
| 2021/0135596 | A1 | 5/2021 | Tsuji |

OTHER PUBLICATIONS

Office Action (Search Report) dated Oct. 30, 2024 in Taiwanese Patent Application 113109934 (in Chinese), 2 pages.

* cited by examiner

DIFFERENTIAL CHOPPER COMPARATOR CAPABLE OF REMOVING KICKBACK NOISE

CROSS-REFERENCE TO RELATED APPLICATION(S)

This application claims priority under 35 U.S.C. § 119 to Korean Patent Application No. 10-2023-0042902, filed on Mar. 31, 2023, in the Korean Intellectual Property Office, the disclosure of which is incorporated by reference herein in its entirety.

TECHNICAL FIELD

Embodiments of the present disclosure described herein relate generally to comparators and more particularly to a differential chopper comparator capable of removing kickback noise.

DISCUSSION OF RELATED ART

Comparators of an analog-to-digital converter compare sample points of an analog waveform with reference voltages in response to a predetermined signal to generate a digital code through a zero crossing technique (a sample point voltage may be approximated as the closest reference voltage to the sample point). In this case, kickback noise may be generated by the signal derived from the analog waveform and introduced into the signal generating device.

Such kickback noise may be a noise component generated when an analog signal induced by a signal from a comparator causes capacitive coupling with a specific element of the comparator. The kickback noise may degrade the overall performance of the system, cause errors in signals, increase a settling time of the comparator, and/or may hinder the operating speed of the comparator.

SUMMARY

Embodiments of the present disclosure provide a differential chopper comparator capable of removing kickback noise.

According to an embodiment of the present disclosure, a differential chopper comparator includes an input terminal circuit that receives a first input signal and a second input signal and selectively switches the first and second input signals to intermediate circuit points, at least one chopper circuit that generates a first amplified signal and a second amplified signal by amplifying a difference between the first input signal and the second input signal at the intermediate circuit points, a comparison circuit that compares the first amplified signal with the second amplified signal, digitizes the comparison result, and outputs a digital signal at a logic level, and a compensation circuit that offsets the first amplified signal and the second amplified signal and thereby remove kickback noise induced in the input terminal circuit.

In various embodiments:

The at least one chopper circuit may include a first chopper circuit connected to the input terminal circuit and a second chopper circuit disposed between the first chopper circuit and the comparison circuit, and each of the first chopper circuit and the second chopper circuit may include a plurality of amplifiers.

The input terminal circuit may include a first switch disposed between a first input signal terminal and a first comparison node and that selectively transfers the first input signal to the first comparison node in response to a first equalization (control) signal, a second switch disposed between the first input signal terminal and a second comparison node and that selectively transfers the first input signal to the second comparison node in response to a second equalization signal, a third switch disposed between a second input signal terminal and the first comparison node and that selectively transfers the second input signal to the first comparison node in response to the second equalization signal, and a fourth switch disposed between the second input signal terminal and the second comparison node and that selectively transfers the second input signal to the second comparison node in response to the first equalization signal.

The first chopper circuit may include a first amplifier and a second amplifier, a first capacitor disposed between the first comparison node and the first amplifier and that charges via application of the first input signal, and a second capacitor disposed between the second comparison node and the second amplifier and that charges via application of the second input signal.

The first amplifier may include a first inverter connected to the first capacitor and a fifth switch connected to input and output ends of the first inverter and that is turned on or turned off in response to the first equalization signal, and the second amplifier may include a second inverter connected to the second capacitor and a sixth switch connected to input and output ends of the second inverter and that is turned on or turned off in response to the first equalization signal.

The second chopper circuit may include a third amplifier and a fourth amplifier, a third capacitor disposed between the first amplifier and the third amplifier and that charges via application of an output signal of the first amplifier, and a fourth capacitor disposed between the second amplifier and the fourth amplifier and that charges via application of an output signal of the second amplifier.

The third amplifier may include a third inverter connected to the third capacitor and a seventh switch connected to input and output ends of the third inverter and that is turned on or turned off in response to the first equalization signal, and the fourth amplifier may include a fourth inverter connected to the fourth capacitor and an eighth switch connected to input and output ends of the fourth inverter and that is turned on or turned off in response to the first equalization signal.

The compensation circuit may include an eleventh switch having one end connected between the first amplifier and the third capacitor and the other end connected between the second amplifier and the fourth capacitor, and that offsets the first amplified signal and the second amplified signal in response to a fourth equalization signal, and a twelfth switch having one end connected between the third capacitor and the third amplifier and the other end connected between the fourth capacitor and the fourth amplifier, and that offsets the first amplified signal and the second amplified signal in response to the fourth equalization signal.

According to an embodiment of the present disclosure, a differential chopper comparator includes an input terminal circuit that receives a first input signal and a second input signal and including a plurality of switches, at least one chopper circuit connected to the input terminal circuit and including a plurality of capacitors and a plurality of amplifiers which generate a first amplified signal and a second amplified signal, a comparison circuit connected to the at least one chopper circuit and that compares the first amplified signal with the second amplified signal to output a first output signal and a second output signal, and a compensation circuit connected to opposite ends of each of the plurality of capacitors and including a plurality of switches which electrically couple the first amplified signal to the second amplified signal.

According to an embodiment of the present disclosure, a memory device includes a memory cell array including a plurality of memory cells, a clock signal generator that receives an external clock signal to generate an internal clock signal, a data input/output circuit that transfers sensed data from the memory cell array in response to the internal clock signal, and a control logic circuit that outputs first to third control signals to the clock signal generator, and the data input/output circuit includes an input terminal circuit that receives a first input signal and a second input signal, at least one chopper circuit that generates a first amplified signal and a second amplified signal by amplifying a difference between the first input signal and the second input signal, a comparator that compares the first amplified signal with the second amplified signal, digitizes the comparison result, and outputs a digital signal at a logic level, and a compensation circuit that offsets the first amplified signal and the second amplified signal induced in the input terminal circuit.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure may be described in detail and clearly to such an extent that one of ordinary skill in the art may implement the present disclosure.

Figure 1:
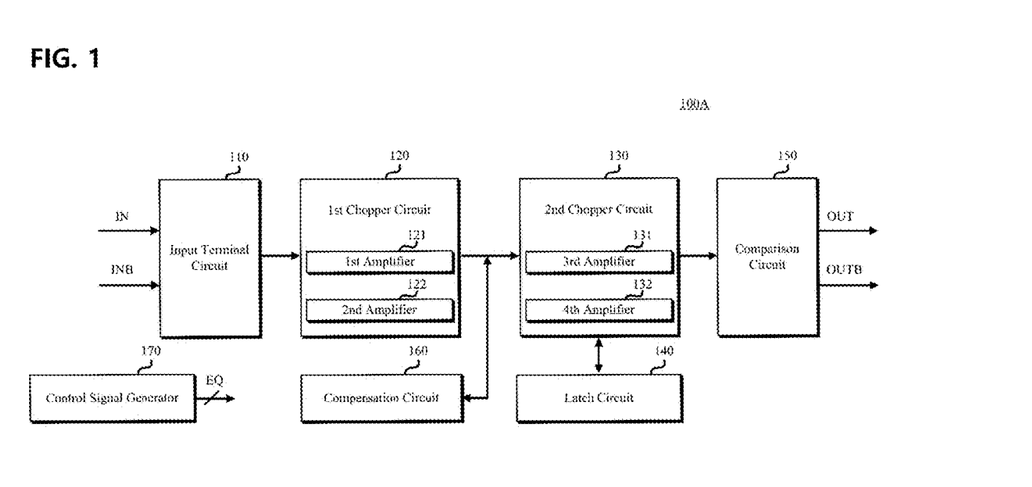
FIG. 1 is a block diagram illustrating an example of a differential chopper comparator, according to an embodiment of the present disclosure.

FIG. 1 is a block diagram illustrating an example of a differential chopper comparator, according to an embodiment of the present disclosure.

A differential chopper comparator 100A according to an embodiment of the present disclosure may compare a first input signal IN with a second input signal INB, may digitize the comparison result, and may output the result. In particular, the differential chopper comparator 100A may remove kickback noise by offsetting amplified signals induced to an input terminal circuit (e.g., signal energy from the amplified signals fed back to the input terminal circuit as noise is removed) during a comparison operation between amplified versions of the first input signal IN and the second input signal INB. Accordingly, the settling time is shortened, and the differential chopper comparator 100A may operate at high speed.

Referring to FIG. 1 in more detail, the differential chopper comparator 100A according to an embodiment of the present disclosure includes an input terminal circuit 110, a first chopper circuit 120, a second chopper circuit 130, a latch circuit 140, a comparison circuit 150, and a compensation circuit 160. A control signal generator 170 may supply control signals (e.g., "equalization signals") to various switches within the comparator 100A as described below.

The input terminal circuit 110 may receive the first input signal IN and the second input signal INB and may be connected to the first chopper circuit 120. For example, the input terminal circuit 110 may selectively input the first input signal IN and the second input signal INB to the first chopper circuit 120 INB. The first and second input signals IN and INB may be differential signals, discussed below.

The first chopper circuit 120 and the second chopper circuit 130 may be electrically connected between the input terminal circuit 110 and the comparison circuit 150. For example, the first chopper circuit 120 and the second chopper circuit 130 are disposed between the input terminal circuit 110 and the comparison circuit 150, and may amplify the first input signal and the second input signal which are received from the input terminal circuit 110 to apply the amplified signals to the comparison circuit 150.

Each of the first chopper circuit 120 and the second chopper circuit 130 may include at least one amplifier. For example, the first chopper circuit 120 may include first and second amplifiers 121 and 122, and the second chopper circuit 130 may include third and fourth amplifiers 131 and 132. However, this is an example and the first chopper circuit 120 and the second chopper circuit 130 may include a plurality of amplifiers.

The first chopper circuit 120 according to an embodiment of the present disclosure may amplify a difference between the first input signal and the second input signal by each amplifier gain. As in the above description, the second chopper circuit 130 may amplify the difference between the amplified signals by the respective amplifier gains.

The latch circuit 140 may be electrically connected to the second chopper circuit 130. For example, the latch circuit 140 may be disposed between the third and fourth amplifiers 131 and 132 of the second chopper circuit 130 and may amplify the received signal in a positive (+) direction. In other embodiments, the latch circuit 140 is omitted.

The comparison circuit 150 may receive the amplified first input signal and the amplified second input signal and may output them as a first output signal and a second output signal. In detail, the comparison circuit 150 may compare the amplified first input signal with the amplified second input signal, may digitize the comparison result, and may output the signal at a logic level. For example, the comparison circuit 150 may compare the analog signals of the first input signal and the second input signal, and may convert and output the comparison result into digital signals, e.g., of data '00', '01', '10', and '11'. The comparison circuit 150 may be, for example, a latch circuit.

The compensation circuit 160 may be electrically connected to the second chopper circuit 130. For example, the compensation circuit 160 may offset the amplified signals induced to the input terminal circuit 110 during a comparison operation between the first input signal and the second input signal. Accordingly, the compensation circuit 160 may remove kickback noise of a circuit.

As described above, the differential chopper comparator 100A according to an embodiment of the present disclosure may amplify a difference between the first input signal and the second input signal by respective amplifier gains through the first to fourth amplifiers 121, 122, 131, and 132, may amplify signals amplified through the latch circuit 140 in a positive (+) direction (without inverting the polarity), and may provide the amplified signals to the comparison circuit 150. In addition, the differential chopper comparator 100A may remove kickback noise generated due to a change in the first input signal and the second input signal through the compensation circuit 160. Due to this, the differential chopper comparator 100A may operate at high speed by reducing the settling time.

Figure 2:
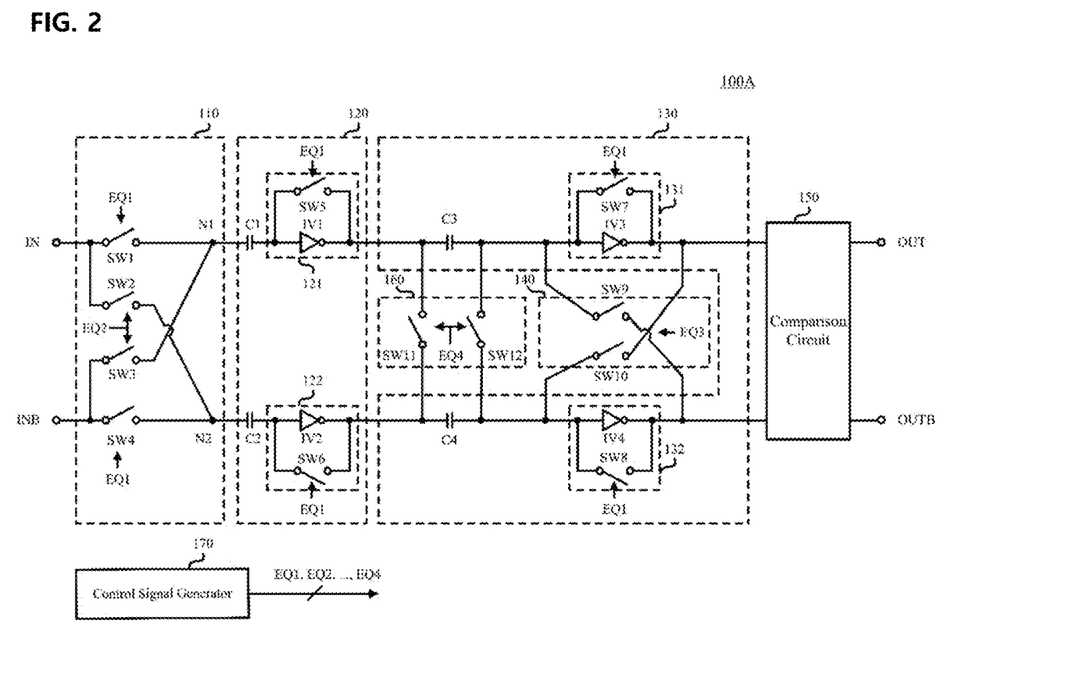
FIG. 2 is a circuit diagram illustrating an example of a differential chopper comparator, according to an embodiment of FIG. 1.

FIG. 2 is a circuit diagram illustrating an example of a differential chopper comparator, according to an embodiment of FIG. 1. For convenience of description, it will be assumed that each chopper circuit includes two amplifiers in FIG. 2.

Referring to FIG. 2, the differential chopper comparator 100A includes the input terminal circuit 110, the first chopper circuit 120, the second chopper circuit 130, the latch circuit 140, the comparison circuit 150, and the compensation circuit 160.

The input terminal circuit 110 may receive a first input signal IN and a second input signal INB, and selectively switch the input signals to intermediate circuit points (e.g., nodes N1 and N2) of the differential chopper comparator 100A to implement functions such as auto zeroing (discussed below) for improving accuracy of the comparator operations. To this end, the input terminal circuit 110 may include switches SW1, SW2, SW3, and SW4. The first switch SW1 and the second switch SW2 may receive the first input signal IN, and the third switch SW3 and SW4 may receive the second input signal INB. The first switch SW1 and the third switch SW3 may be connected to a first comparison node N1, and the second switch SW2 and the fourth switch SW4 may be connected to a second comparison node N2.

The first and fourth switches SW1 and SW4 may be controlled through a first "equalization signal" EQ1, and the second and third switches SW2 and SW3 may be controlled through a second equalization signal EQ2. The first and second equalization signals may be control signals, such as complementary clock signals, generated by the control signal generator 170. For example, when the first equalization signal EQ1 is '1', the first and fourth switches SW1 and SW4 may be closed ("turned on"), and the second and third switches SW2 and SW3 may be open ("turned off"). Accordingly, the first input signal IN may be connected to the first comparison node N1 and the second input signal INB may be connected to the second comparison node N2. In addition, when the second equalization signal EQ2 is '1', the first equalization signal EQ1 becomes '0', the second and third switches SW2 and SW3 may be closed, and the first and fourth switches SW1 and SW4 may be open. Accordingly, the second input signal INB may be connected to the first comparison node N1 and the first input signal IN may be connected to the second comparison node N2. In detail, the first equalization signal EQ1 may be a signal opposite to the second equalization signal EQ2.

The first and second input signals IN and INB may be a differential signal pair. In this case, the first and second input signals IN and INB may be "opposite" (complementary) to each other. Herein, two signals that are said to be "opposite" to each other or "have phases opposite to each other" may mean that their voltage levels at any point in time are equal and opposite in direction to a reference voltage. For instance, when the reference voltage is zero, the voltages of the two signals are equal in amplitude but opposite in polarity. Regarding logic level signals herein, when two logic level signals are said to be opposite to one another, one of the signals is a logic "1" and the other signal is a logic "0".

When the first and second input signals IN and INB are a differential signal pair, the first input signal IN may be provided by first and second conductors, in which the first conductor provides a "signal voltage" VS and the second conductor provides a reference voltage VR, such that the first input signal IN may equal (VS-VR). The second input signal INB may be provided by third and fourth conductors, in which the third conductor provides the reference voltage VR and the fourth conductor provides the signal voltage, such that the second input signal INB may equal (VR-VS). The differential chopper comparator 100A may function to determine whether VS exceeds VR by comparing IN with INB (which is equivalent to comparing (VS-VR) with (VR-VS) and is also equivalent to comparing VS to VR. When switches SW1 and SW4 are closed (and switches SW2 and SW3 are open), the VS component of IN may be switched to node N1 and the VR component of INB may be switched to node N2. When switches SW2 and SW3 are closed (and switches SW1 and SW4 are open), the VR component of IN may be switched to node N2 and the VS component of INB may be switched to node N1. Hereafter, when describing amplification of the input signals IN and INB, in the case of differential signals, the amplification may be understood as an amplification (by any of the inverters discussed hereafter) of either the VS component or the VR component of the respective signals IN or INB (depending on the switching states of the switches SW1 to SW4).

The first chopper circuit 120 may include a plurality of capacitors C1 and C2, switches SW5 and SW6, and inverters IV1 and IV2. The first amplifier 121 may include the first inverter IV1 and a fifth switch SW5 connected to input and output ends of the first inverter IV1, and the first capacitor C1 may be disposed between the first comparison node N1 and the first amplifier 121. The second amplifier 122 may include the second inverter IV2 and the sixth switch SW6 connected to input and output ends of the second inverter IV2, and the second capacitor C2 may be connected between the second comparison node N2 and the second amplifiers 122.

The fifth and sixth switches SW5 and SW6 may be controlled through the first equalization signal EQ1. For example, when the first equalization signal EQ1 is '1', the fifth and sixth switches SW5 and SW6 may be closed. Accordingly, an input signal of the first amplifier 121 may become the threshold of the first inverter IV1, and an input signal of the second amplifier 122 may become the threshold of the second inverter IV2.

The second chopper circuit 130 may include a plurality of capacitors C3 and C4, switches SW7 and SW8, and inverters IV3 and IV4. The third amplifier 131 may include the seventh switch SW7 connected to input and output ends of the third inverter IV3, and the third capacitor C3 may connect the first amplifier 121 to the third amplifier 131. The fourth amplifier 132 may include the eighth switch SW8 connected to input and output ends of the fourth inverter IV4, and the fourth capacitor C4 may connect the second amplifier 122 to the fourth amplifier 132.

The seventh and eighth switches SW7 and SW8 may be controlled through the first equalization signal EQ1. For example, when the first equalization signal EQ1 is '1', the seventh and eighth switches SW7 and SW8 may be closed. Accordingly, an input signal of the third amplifier 131 may become the threshold of the third inverter IV3, and an input signal of the fourth amplifier 132 may become the threshold of the fourth inverter IV4.

The latch circuit 140 may include switches SW9 and SW10. One end of the ninth switch SW9 may be connected between the third capacitor C3 and the third amplifier 131, and the other end of the ninth switch SW9 may be connected to a node between the fourth amplifier 132 and the comparison circuit 150. One end of the tenth switch SW10 may be connected to a node between the fourth capacitor C4 and the fourth amplifier 132, and the other end of the tenth switch SW10 may be connected between the third amplifier 131 and the comparison circuit 150.

The ninth and tenth switches SW9 and SW10 may be controlled through a third equalization signal EQ3. For example, when the third equalization signal EQ3 is '1', the ninth and tenth switches SW9 and SW10 may be closed. Accordingly, the latch circuit 140 may amplify the received signal in a positive (+) direction.

The comparison circuit 150 may be electrically connected to the second chopper circuit 130 and may, based on a result of a comparison of the amplified input signals, output first and second output signals OUT and OUTB. For example, the comparison circuit 150 may receive the first and second input signals IN and INB amplified by the second chopper circuit 130 and may compare the first and second input signals IN and INB to output the first and second output signals OUT and OUTB at corresponding logic levels. For example, when the first input signal IN is greater than the second input signal INB, the first output signal OUT may be at a high level and the second output signal OUTB may be at a low level. In addition, when the first input signal IN is less than the second input signal INB, the first output signal OUT may be at a low level and the second output signal OUTB may be at a high level.

The compensation circuit 160 may be configured to include switches SW11 and SW12. One end of the eleventh switch SW11 may be connected between the first amplifier 121 and the third capacitor C3, and the other end of the eleventh switch SW11 may be connected between the second amplifier 122 and the fourth capacitor C4. One end of the twelfth switch SW12 may be connected between the third capacitor C3 and the third amplifier 131, and the other end of the twelfth switch SW12 may be connected between the fourth capacitor C4 and the fourth amplifier 132.

The eleventh and twelfth switches SW11 and SW12 may be controlled through a fourth equalization signal EQ4. For example, when the fourth equalization signal EQ4 is '1', the eleventh and twelfth switches SW11 and SW12 may be closed (ON). In detail, the compensation circuit 160 may offset the amplified signals induced to the input terminal circuit 110 through the capacitors C1, C2, C3, and C4. Accordingly, the compensation circuit 160 may remove the kickback noise.

As described above, the differential chopper comparator 100A according to an embodiment of the present disclosure may control the switches SW1 to SW12 through the first to fourth equalization signals EQ1, EQ2, EQ3, and EQ4. The differential chopper comparator 100A may amplify and compare the first input signal and the second input signal. In addition, the differential chopper comparator 100A may offset amplified signals input to the input terminal circuit 110. Due to this, the differential chopper comparator 100A may operate at high speed by reducing the settling time.

Figure 3:
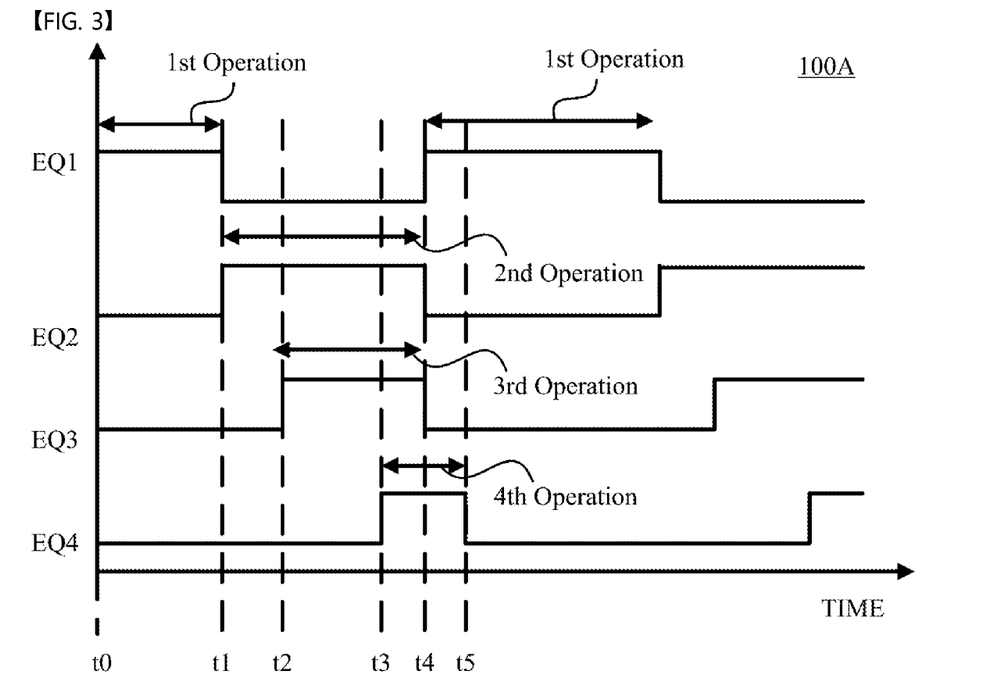
FIG. 3 is a timing diagram for describing a differential chopper comparator of FIG. 2.

FIG. 3 is a timing diagram for describing example operations of a differential chopper comparator of FIG. 2.

Referring to FIG. 3, first to fourth actions of the differential chopper comparator 100A may be defined according to first to fourth equalization signals EQ1, EQ2, EQ3, and EQ4. The first action may be defined as a case where the first equalization signal EQ1 is '1'. The second action may be defined as a case where the second equalization signal EQ2 is '1'. The third action may be defined as a case where the third equalization signal EQ3 is '1'. The fourth action may be defined as a case where the fourth equalization signal EQ4 is '1'. Accordingly, the first action may be defined to occur between zeroth to first time points t0 to t1, the second action may be defined to occur between first to fourth time points t1 to t4, the third action may be defined to occur between second to fourth time points t2 to t4, and the fourth action may be defined to occur between third to fifth time points t3 to t5.

At the zeroth time point t0, when the first equalization signal EQ1 transitions to '1', the differential chopper comparator 100A may perform the first action of automatically adjusting a zero point of the circuit. In this regard, the differential chopper comparator 100A may perform an auto zeroing operation from the zeroth time point t0 when the first equalization signal EQ1 is '1' to the first time point t1 when the second equalization signal EQ2, which is opposite to the first equalization signal EQ1, transitions to '1'.

At the first time point t1, when the second equalization signal EQ2 transitions to '1', the differential chopper comparator 100A may begin a second action of comparing input signals.

At the second time point t2, when the third equalization signal EQ3 transitions to '1', the differential chopper comparator 100A may perform the third action of amplifying signals in the positive (+) direction.

At the third time point t3, when the fourth equalization signal EQ4 transitions to '1', the differential chopper comparator 100A may perform the fourth action of offsetting the amplified signals and thereby removing kickback noise.

At the fourth time point t4, when the second and third equalization signals EQ2 and EQ3 transition to '0' in the differential chopper comparator 100A, the first equalization signal EQ1, which is a signal opposite to the second equalization signal EQ2, may transition to '1'. As illustrated, the differential chopper comparator 100A may perform the second and third actions until the fourth time point t4. In addition, the differential chopper comparator 100A may initiate the first action as the first equalization signal EQ1 transitions to '1'.

At the fifth time point t5, when the fourth equalization signal EQ4 transitions to '0', the differential chopper comparator 100A may end the fourth action. In detail, the differential chopper comparator 100A may offset the amplified signals from the third time point t3 to the fifth time point t5 to remove kickback noise.

As a result, since the differential chopper comparator 100A may shorten the first operation time by performing the fourth action, the differential chopper comparator 100A may operate at high speed.

Figure 4A:
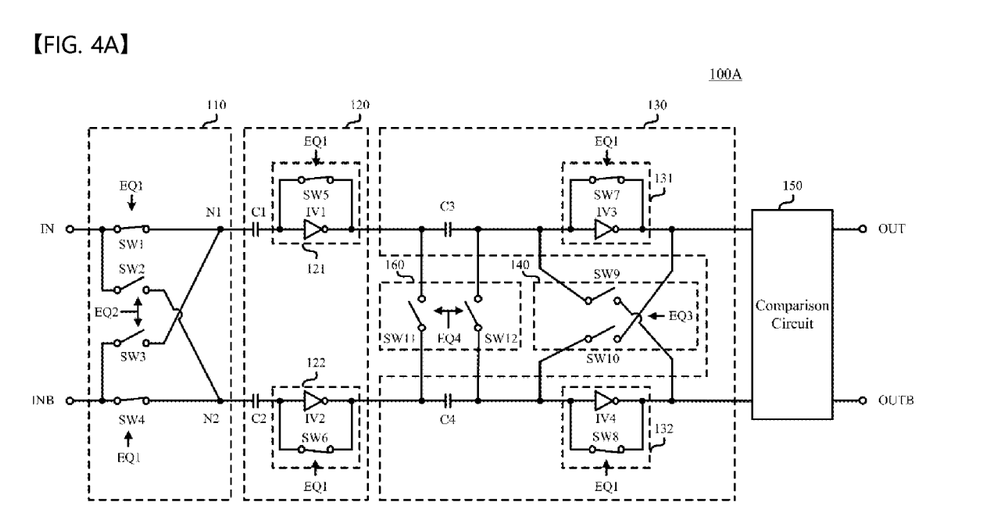
FIGS. 4A, 4B, 4C and 4D are circuit diagrams for describing an operation of a differential chopper comparator of FIG. 2.
Figure 4B:
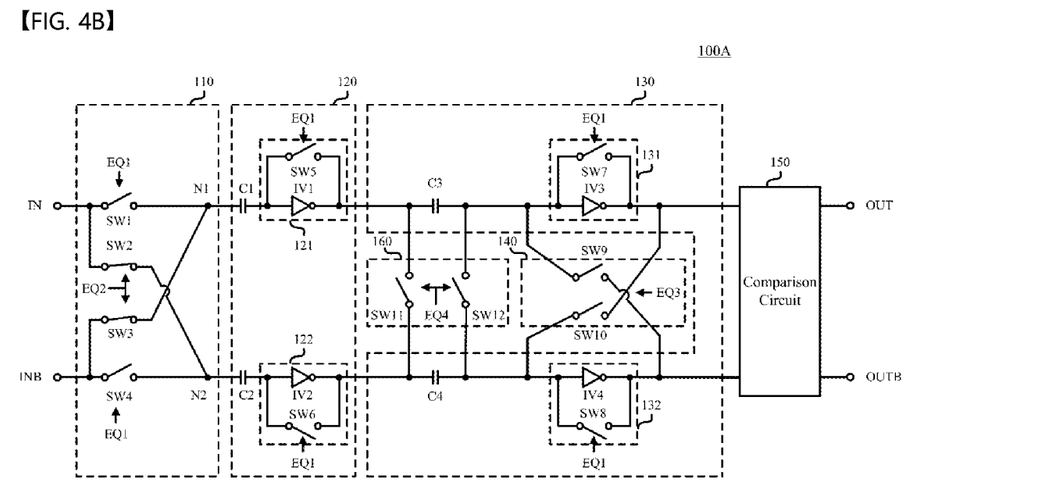
Figure 4C:
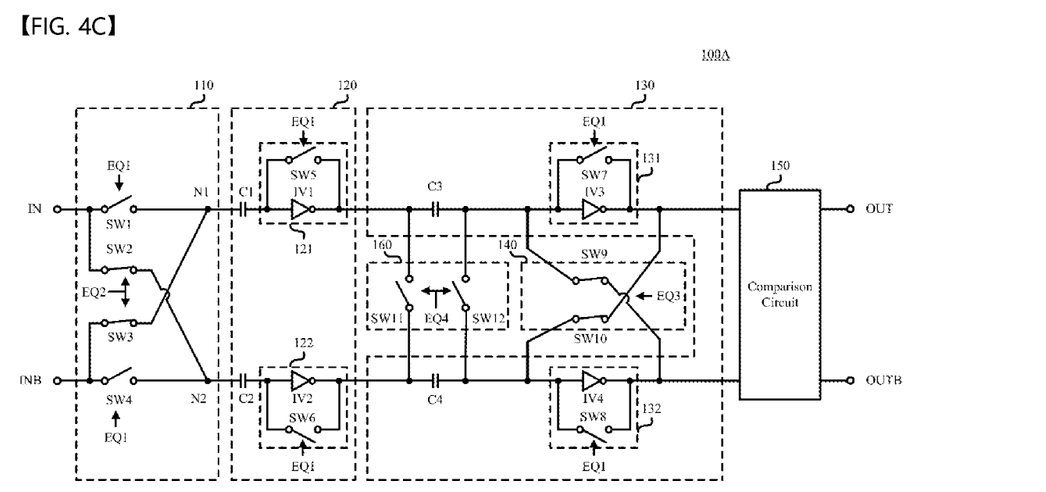
Figure 4D:
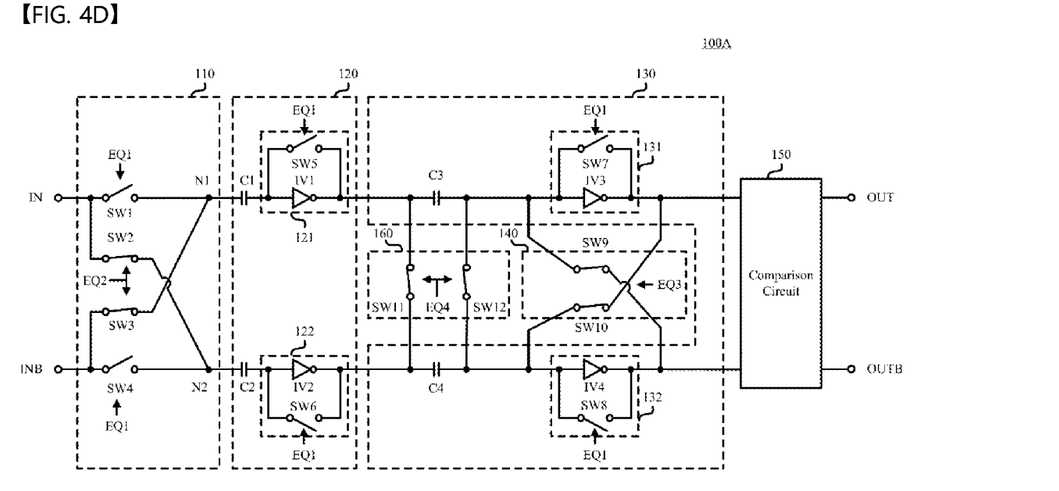

FIGS. 4A to 4D are circuit diagrams for describing an operation of a differential chopper comparator of FIG. 2. In detail, in FIG. 4A, an example in which the differential chopper comparator of FIG. 1 adjusts the zero point is illustrated. In FIG. 4B, an example in which the differential chopper comparator of FIG. 1 compares the input signals is illustrated. In FIG. 4C, an example in which the differential chopper comparator of FIG. 1 amplifies signals is illustrated. In FIG. 4D, an example is illustrated in which the differential chopper comparator of FIG. 1 offsets the amplified signals.

First, referring to FIG. 4A, when the first equalization signal EQ1 is '1', the differential chopper comparator 100A closes the first and fourth to eighth switches SW1, SW4, SW5, SW6, SW7, and SW8, and opens the second, third, and ninth to twelfth switches SW2, SW3, SW9, SW10, SW11, and SW12. Accordingly, the first input signal IN may charge the first capacitor C1, and the second input signal INB may charge the second capacitor C2. (When the first and second input signals IN and INB are applied to the first and second capacitors C1 and C2, respectively, during the time period of the first action of FIG. 3, the capacitors C1 and C2 may charge up to levels of the first and second input signals IN and INB, respectively.) Further, the differential chopper comparator 100A may perform an auto zeroing operation that reduces the amplified signals according to the first equalization signal EQ1.

Referring now to FIG. 4B, when the second equalization signal EQ2 is '1' at time t1, the differential chopper comparator 100A closes the second and third switches SW2 and SW3, and opens the first, fourth to twelfth switches SW1, SW4, SW5, SW6, SW7, SW8, SW9, SW10, SW11, and SW12. Accordingly, since the second input signal INB is input to one end of the first capacitor C1, the differential chopper comparator 100A may amplify the signal by multiplying the difference between the first input signal IN and the second input signal INB by threshold values of the first and third inverters IV1 and IV3. In addition, since the first input signal IN is input to one end of the second capacitor C2, the differential chopper comparator 100A may amplify the signal by multiplying the difference between the second input signal INB and the first input signal IN by threshold values of the second and fourth inverters IV2 and IV4. In detail, the differential chopper comparator 100A may perform a comparison operation of amplifying and comparing the difference between the first input signal IN and the second input signal INB based on the second equalization signal EQ2.

Referring to FIG. 4C, when the second and third equalization signals EQ2 and EQ3 are '1', the differential chopper comparator 100A closes the second, third, ninth and tenth switches SW2, SW3, SW9, and SW10, and opens the first, fourth to eighth, eleventh, and twelfth switches SW1, SW4, SW5, SW6, SW7, SW8, SW11, and SW12. Accordingly, the differential chopper comparator 100A may amplify the difference between the first input signal IN and the second input signal INB that have been amplified by the first to fourth inverters IV1, IV2, IV3, and IV4 in the positive (+) direction. Additionally, the imbalance of the output amplitude of the amplified signals may be increased through the latch circuit 140. In other words, the differential chopper comparator 100A may perform an amplification operation of amplifying the amplified signals based on the second and third equalization signals EQ2 and EQ3 in a positive (+) direction.

Referring to FIG. 4D, the differential chopper comparator 100A, when the second to fourth equalization signals EQ2, EQ3, and EQ4 are '1', closes the second, third, and ninth to twelfth switches SW2, SW3, SW9, SW10, SW11, and SW12, and opens the first and fourth to eighth switches SW1, SW4, SW5, SW6, SW7, and SW8. Accordingly, the differential chopper comparator 100A may offset the amplified signals by coupling the amplified signals having phases opposite to each other. To this end, the differential chopper comparator 100A may offset the amplified signals induced to the input terminal circuit 110 through the first to fourth capacitors C1, C2, C3, and C4. In other words, the differential chopper comparator 100A may perform an offset operation of coupling and offsetting amplified signals, which have phases opposite to each other based on the second to fourth equalization signals EQ2, EQ3, and EQ4.

As described above, the differential chopper comparator 100A according to an embodiment of the present disclosure may operate the switches SW1 to SW10 based on the first and second equalization signals EQ1 and EQ2 to amplify and compare the difference between the first input signal IN and the second input signal INB. In addition, the differential chopper comparator 100A may operate the eleventh and twelfth switches SW11 and SW12 based on the third equalization signal EQ3 to remove the kickback noise of the circuit and to reduce the settling time.

Figure 5A:
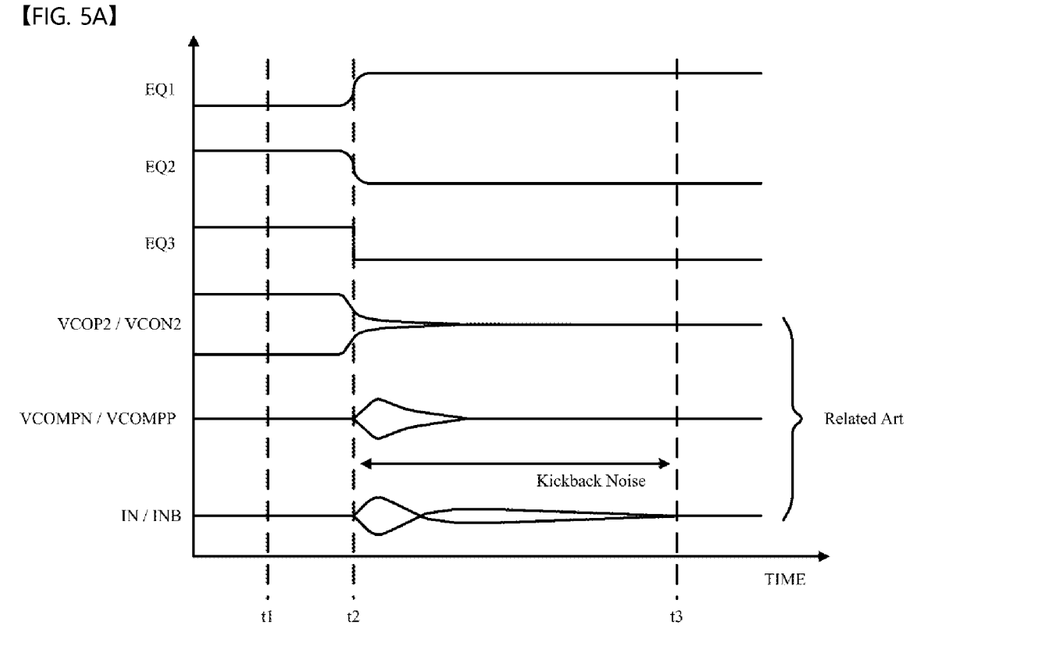
FIGS. 5A and 5B are timing diagrams for describing an example of a differential chopper comparator according to an embodiment of FIG. 1 and a differential chopper comparator without a kickback noise removal function.
Figure 5B:
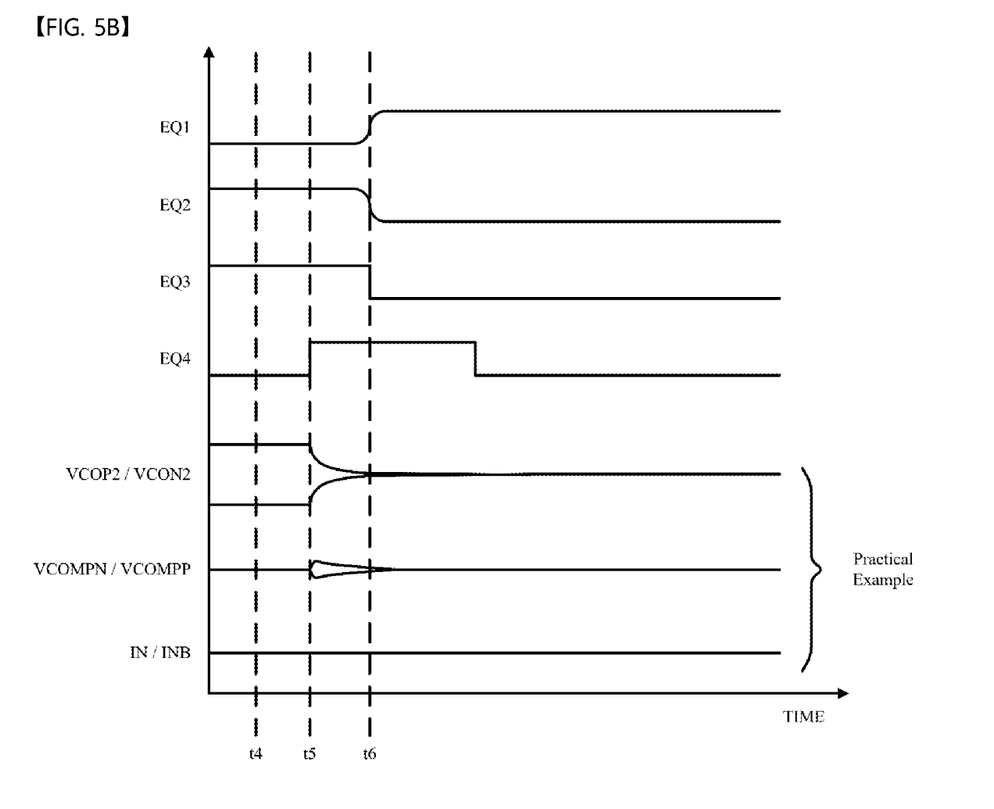

FIGS. 5A and 5B are timing diagrams for describing an example of a differential chopper comparator according to an embodiment of FIG. 1 and a differential chopper comparator without a kickback noise removal function. For convenience of description, it will be assumed that the comparator corresponding to FIG. 5A is the same as the differential chopper comparator 100A, but the compensation circuit 160 is excluded.

In detail, FIGS. 5A and 5B are timing diagrams illustrating example voltages corresponding to signal levels of circuits such as the differential comparator 100A. For example, the output signal of the first amplifier 121 may be defined as an output voltage VCOMPP of the first amplifier 121, and the output signal of the second amplifier 122 may be defined as an output voltage VCOMPN of the second amplifier 122. In addition, the input signal of the third amplifier 131 may be defined as an input voltage VCOP2 of the third amplifier 131, and the input signal of the fourth amplifier 132 may be defined as an input voltage VCON2 of the fourth amplifier 132. Note that the times denoted t1 to t5 in FIGS. 5A and 5B may not correspond to the times t1 to t5 in FIG. 4.

Referring to FIG. 5A, at the first time point t1, when the first and fourth equalization signals EQ1 and EQ4 are '0', the comparator may perform an operation of comparing the input signals based on the second and third equalization signals EQ2 and EQ3.

At the second time point t2, when the first equalization signal EQ1 transitions to '1' and the second and third equalization signals EQ2 and EQ3 transition to '0', the comparator may end the operation of comparing the input signals may perform the auto zeroing operation. Accordingly, the input voltage VCOP2 of the third amplifier 131 and the input voltage VCON2 of the fourth amplifier 132 included in the comparator may be induced to the output voltage VCOMPP of the first amplifier 121 and the output voltage VCOMPN of the second amplifier 122 through the second and third capacitors C2 and C3. In detail, the comparator may generate kickback noise in the first input signal IN and the second input signal INB when the amplified voltages are induced to the input terminal.

At the third time point t3, the first input signal IN and the second input signal INB of the comparator may be settled. In detail, the comparator may adjust the zero points of the first input signal IN and the second input signal INB from the second time point t2 to the third time point t3.

In contrast, referring to FIG. 5B, when the first and fourth equalization signals EQ1 and EQ4 are '0' at the fourth time point t4, the differential chopper comparator 100A may perform an operation of comparing input signals based on the second and third equalization signals EQ2 and EQ3.

At the fifth time point t5, when the fourth equalization signal EQ4 transitions to '1', the differential chopper comparator 100A may short the eleventh switch SW11 to offset the output voltage VCOMPP of the first amplifier 121 and the output voltage VCOMPN of the second amplifier 122, which have different phases from each other. In addition, the differential chopper comparator 100A may offset the input voltage VCOP2 of the third amplifier 131 and the input voltage VCON2 of the fourth amplifier 132, which have different phases from each other, by closing the twelfth switch SW12. Accordingly, the first input signal IN and the second input signal INB of the differential chopper comparator 100A may be settled.

At the sixth time point t6, when the first equalization signal EQ1 transitions to '1' and the second and third equalization signals EQ2 and EQ3 transition to '0', the differential chopper comparator 100A may end the operation of comparing the input signals, and may perform the auto zeroing operation.

As described above, the differential chopper comparator 100A according to an embodiment of the present disclosure may remove kickback noise by connecting the amplified signals, which have phases opposite to each other through the compensation circuit 160, and may have a shorter settling time than the conventional comparator. Accordingly, the differential chopper comparator 100A may operate at a higher speed than the conventional comparator.

Figure 6:
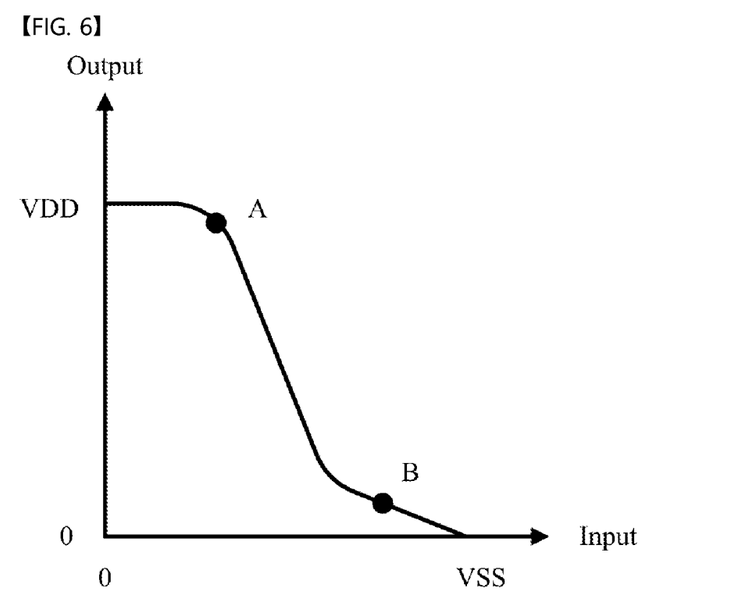
FIG. 6 is a diagram illustrating transfer characteristics of inverters of FIGS. 2 to 5B.

FIG. 6 is a diagram illustrating transfer characteristics of inverters of FIGS. 2 to 5B.

Referring to FIG. 6, the differential chopper comparator 100A may amplify the first input signal IN and the second input signal INB by using transfer characteristics of the third and fourth inverters IV3 and IV4. For example, in the transfer characteristics of the third and fourth inverters IV3 and IV4 to generate an output signal "Output" from an input signal 'Input, the differential chopper comparator 100A may change the output signal of the third inverter IV3 up to a point 'A' close to a power voltage VDD using the ninth and tenth switches SW9 and SW10 (in other words, the third inverter IV3 may operate close to or in a saturation region). Further, the output signal of the fourth inverter IV4 may be changed up to a point 'B' close to a ground signal VSS (thus, the fourth inverter IV4 may operate in approximately a linear amplification region). As described above, the differential chopper comparator 100A according to an embodiment of the present disclosure may relatively easily compare the difference between the first input signal IN and the second input signal INB by using characteristics of the inverters.

The differential chopper comparator 100A described in FIGS. 1 to 6 may be modified or applied in various ways in other embodiments. Hereinafter, various modifications and application examples of the present disclosure will be described in more detail.

Figure 7:
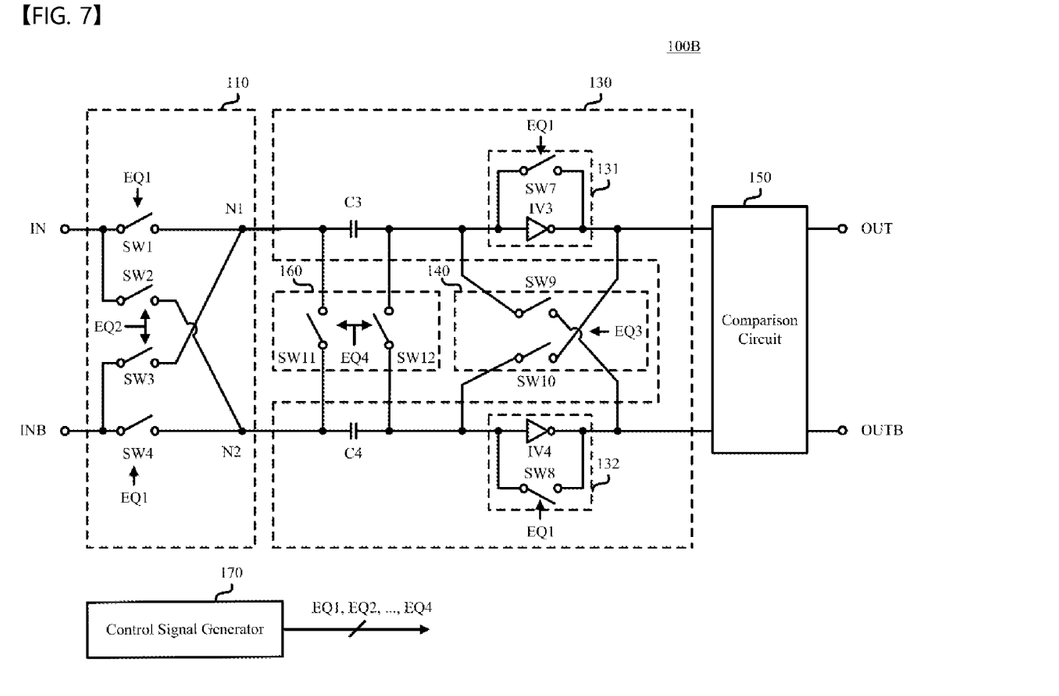
FIG. 7 is a diagram illustrating another example of a differential chopper comparator of FIG. 1.

FIG. 7 is a diagram illustrating another example of a differential chopper comparator of FIG. 1. FIG. 7 illustrates an example in which the first chopper circuit 120 is excluded; otherwise, the configuration of FIG. 7 is similar to that of FIG. 1. Therefore, the same or similar other components are denoted using the same or similar reference numerals, and additional descriptions will be omitted to avoid redundancy.

Referring to FIG. 7, a differential chopper comparator 100B may exclude the first chopper circuit 120. For example, the differential chopper comparator 100B may include the input terminal circuit 110, the second chopper circuit 130, the latch circuit 140, the comparison circuit 150, the compensation circuit 160 and the control signal generator 170. Accordingly, the differential chopper comparator 100B may amplify the difference between the first input signal IN and the second input signal INB according to the first to fourth equalization signals EQ1, EQ2, EQ3, and EQ4.

The differential chopper comparator 100B may implement a chopper circuit capable of amplifying a difference between the first input signal IN and the second input signal INB to compare signals. Accordingly, the differential chopper comparator 100B may implement a circuit for high-speed operation.

Figure 8:
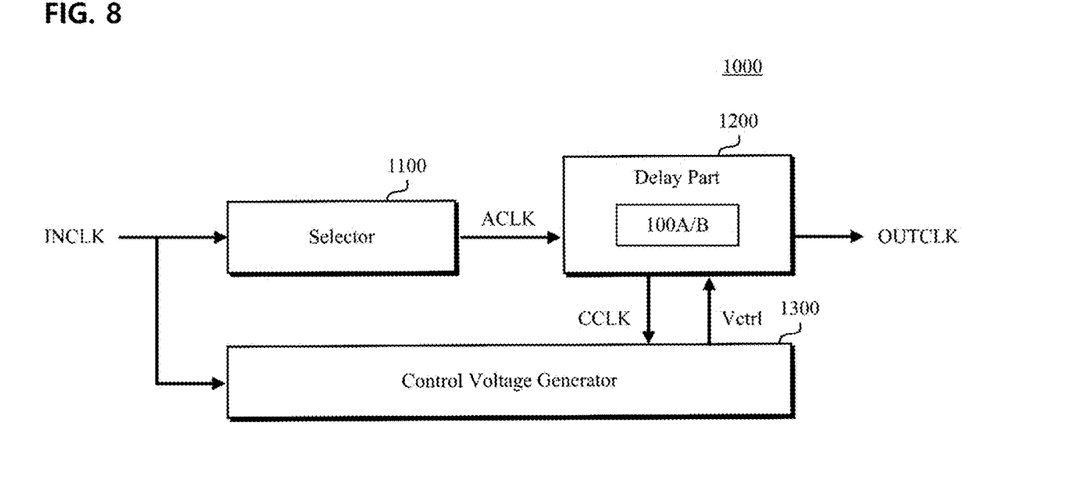
FIG. 8 is a block diagram of a delay locked loop circuit, according to an embodiment of the present disclosure.

FIG. 8 is a block diagram of a delay locked loop circuit, according to an embodiment of the present disclosure.

A delay locked loop circuit according to an embodiment of the present disclosure may be implemented to include the differential chopper comparator described in FIGS. 1 to 7. Accordingly, kickback noise may be removed, and high-speed operation may be possible.

Referring to FIG. 8, a delay locked loop circuit 1000 according to an embodiment of the present disclosure includes a selector 1100, a delay part 1200, and a control voltage generator 1300. The delay locked loop circuit 1000 may generate an output clock OUTCLK used in a semiconductor device. For example, the delay locked loop circuit 1000 may receive a plurality of data signals having different delay times from the semiconductor device and may sample the plurality of data signals. Accordingly, the delay locked loop circuit 1000 may reduce the overall delay time of the circuit.

The selector 1100 may select a delay line to be activated by receiving an input clock INCLK and applying the input clock INCLK to one of the plurality of delay lines as an action clock ACLK.

The delay part 1200 may include the plurality of delay lines, and may generate the output clock OUTCLK by delaying the action clock ACLK in response to a control voltage signal Vctrl. The delay part 1200 may generate a comparison clock CCLK corresponding to the action clock ACLK and may transmit the generated comparison clock CCLK to the control voltage generator 1300.

The control voltage generator 1300 may output the control voltage signal Vctrl corresponding to the action clock ACLK and the comparison clock CCLK. For example, the control voltage generator 1300 may output a signal corresponding to a delay (or phase) difference between the action clock ACLK and the comparison clock CCLK, may charge or discharge electric charges in response to signals, and may filter and compare voltages to output the control voltage signal Vctrl. Accordingly, the delay part 1200 may generate the output clock OUTCLK in response to the control voltage signal Vctrl, and may feed back the comparison clock CCLK to the control voltage generator 1300.

As described above, the delay locked loop circuit 1000 may include a comparator (e.g., configured as a portion of the delay part 1200) that compares a delay difference between the action clock ACLK corresponding to the input clock INCLK and the comparison clock CCLK to generate the output clock OUTCLK used in the semiconductor device. The comparator should be capable of high-speed operation and may be the same as the comparator 100A in FIG. 2 or the comparator 100B of FIG. 7.

Figure 9:
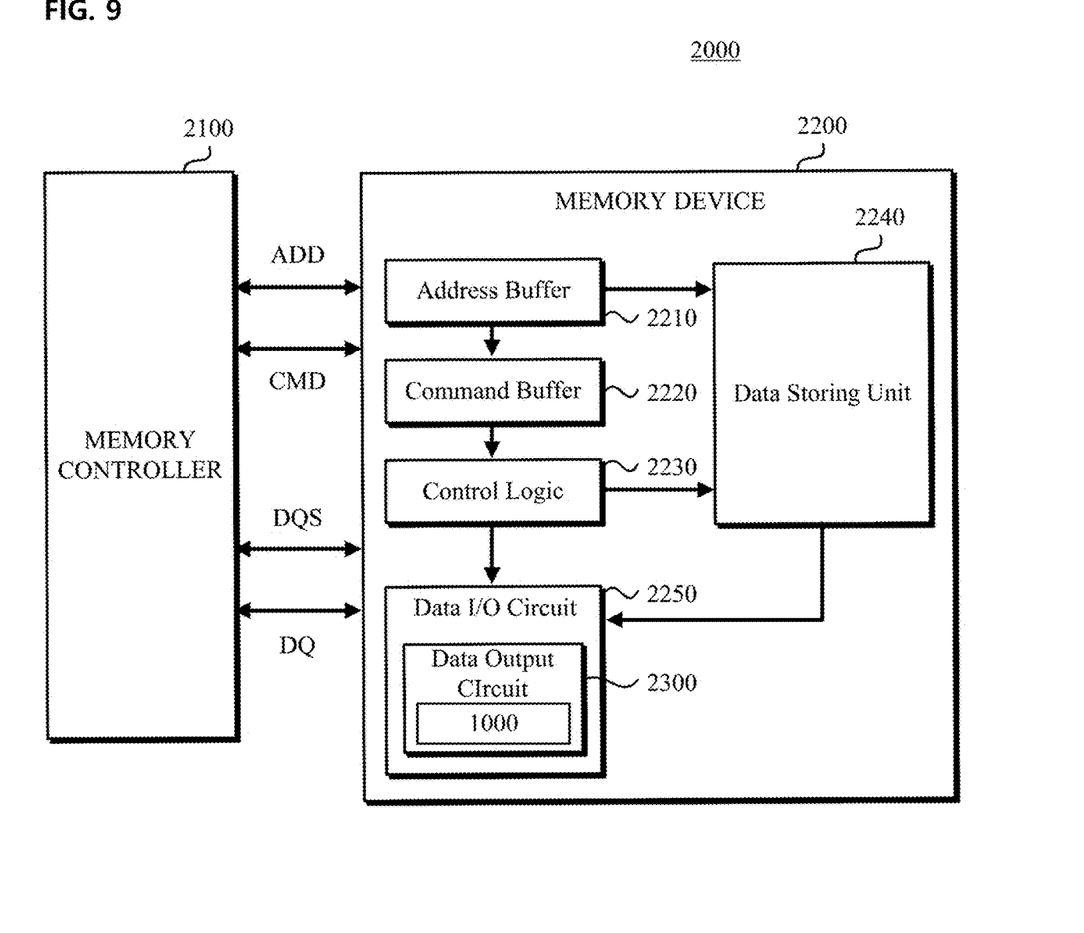
FIG. 9 is a block diagram of a memory system, according to an embodiment of the present disclosure.

FIG. 9 is a block diagram of a memory system, 2000, according to an embodiment of the present disclosure. The memory system 2000 may include a memory controller 2100 and a memory device 2200. The memory controller 2100 may transmit various commands CMD for controlling operations of the memory device 2200 and address information ADD to the memory device 2200, for a memory cell array to be read, written, or tested. In addition, the memory controller 2100 may transfer write data to be written to the memory cell array to the memory device 2200 and may receive read data from the memory device 2200.

The memory device 2200 may include an address buffer 2210, a command buffer 2220, control logic 2230, a data storing unit 2240, and a data input/output circuit 2250.

The address buffer 2210 may receive the address information ADD from the memory controller 2100 to temporarily store the address information ADD, and may transmit the address information ADD to the data storing unit 2240 under the control of the control logic 2230.

The command buffer 2220 may receive the command CMD from the memory controller 2100 to temporarily store the command CMD, and may transmit the command CMD to the control logic 2230 under the control of the control logic 2230.

The control logic 2230 may control overall operations of the memory device 2200. The control logic 2230 may include a command decoder, a clock generator, and a mode register set (MRS) circuit.

The data storing unit 2240 may store data and generate read data corresponding to signals. For example, the data storing unit 2240 includes word lines, bit lines, and memory cells each connected to each of the word lines and each of the bit lines. Each of the memory cells may store data of at least 1 bit. The memory cells may be implemented as a non-volatile memory that can store data regardless of whether power is supplied or a volatile memory that can store data while power is supplied, and a fuse-cutting method storing data physically by using a laser or a programming method storing data electrically may be used. For example, the memory cells may include a memory cell of a dynamic random access memory (DRAM), a static random access memory (SRAM), a synchronous dynamic random access memory (SDRAM), an electrically erasable programmable read-only memory (EEPROM), a flash memory, a magnetic RAM (MRAM), a conductive bridging RAM (CBRAM), a ferroelectric RAM (FeRAM), a phase change RAM (PRAM), or resistive RAM (RRAM or ReRAM).

The data storing unit 2240 may sense and amplify a signal developed from at least one bit line to generate read data corresponding to the amplified signal, and may transmit the read data to the data input/output circuit 2250.

The data input/output circuit 2250 may include a data input circuit connected to a data input/output terminal and a data output circuit 2300, which operate under the control of the control logic 2230. The data output circuit 2300 may generate a data signal DQ corresponding to a clock and may transmit the data signal DQ to the memory controller 2100 under the control of the control logic 2230.

In an embodiment of the present disclosure, the data output circuit 2300 may include the delay locked loop circuit 1000. The data output circuit 2300 may sample the plurality of data signals DQ having different delay times using the same strobe signal DQS and may store the sampled data signals DQ. Accordingly, the delay time of the strobe signal DQS may be rapidly detected, and the overall time required for data training may be reduced.

Figure 10:
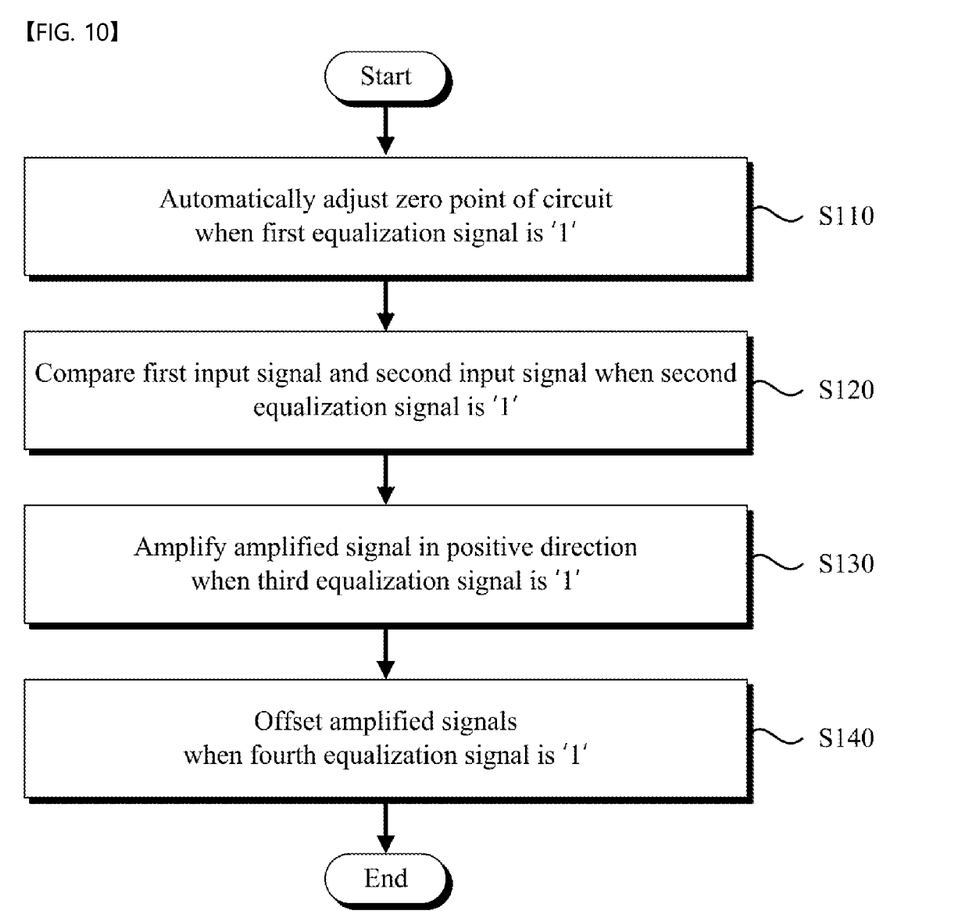
FIG. 10 is a flowchart illustrating an example of an operation of a differential chopper comparator, according to an embodiment of the present disclosure.

FIG. 10 is a flowchart illustrating an example of an operation of a differential chopper comparator (e.g., 100A or 100B), according to an embodiment of the present disclosure.

Referring to FIG. 10, in operation S110, when the first equalization signal EQ1 is '1', the differential chopper comparator 100A/100B may automatically adjust the zero point of the circuit.

In operation S120, when the second equalization signal EQ2 is '1', the differential chopper comparator 100A/100B may compare the first input signal IN with the second input signal INB.

In operation S130, when the third equalization signal EQ3 is '1', the differential chopper comparator 100A/100B may amplify the amplified signals.

In operation S140, when the fourth equalization signal EQ4 is '1', the differential chopper comparator 100A/100B may offset the amplified signals to each other.

According to an embodiment of the present disclosure, a differential chopper comparator may remove kickback noise in a circuit. Accordingly, the differential chopper comparator may operate at high speed.

The above descriptions are specific embodiments for carrying out the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A differential chopper comparator comprising:
    an input terminal circuit configured to receive a first input signal and a second input signal and selectively switch the first and second input signals to intermediate circuit points;
    at least one chopper circuit configured to generate a first amplified signal and a second amplified signal by amplifying a difference between the first input signal and the second input signal at the intermediate circuit points;
    a comparison circuit configured to compare the first amplified signal with the second amplified signal, to digitize a result of the comparison, and to output a digital signal at a logic level; and
    a compensation circuit configured to offset the first amplified signal and the second amplified signal and thereby remove kickback noise induced in the input terminal circuit, by selectively forming, via a plurality of switches, a plurality of circuit paths each coupling the first amplified signal to the second amplified signal at a same amplification stage, or each coupling the first input signal to the second input signal.

2. The differential chopper comparator of claim 1, wherein the at least one chopper circuit includes:
    a first chopper circuit connected to the input terminal circuit; and
    a second chopper circuit disposed between the first chopper circuit and the comparison circuit, and
    wherein each of the first chopper circuit and the second chopper circuit includes a plurality of amplifiers.

3. The differential chopper comparator of claim 2, wherein the input terminal circuit includes:
    a first switch disposed between a first input signal terminal and a first comparison node and configured to selectively transfer the first input signal to the first comparison node in response to a first control signal;

a second switch disposed between the first input signal terminal and a second comparison node and configured to selectively transfer the first input signal to the second comparison node in response to a second control signal;
a third switch disposed between a second input signal terminal and the first comparison node and configured to selectively transfer the second input signal to the first comparison node in response to the second control signal; and
a fourth switch disposed between the second input signal terminal and the second comparison node and configured to selectively transfer the second input signal to the second comparison node in response to the first control signal.

4. The differential chopper comparator of claim 3, wherein the first chopper circuit includes:
a first amplifier and a second amplifier;
a first capacitor disposed between the first comparison node and the first amplifier and configured to charge via application of the first input signal; and
a second capacitor disposed between the second comparison node and the second amplifier and configured to charge via application of the second input signal.

5. The differential chopper comparator of claim 4, wherein the first amplifier includes:
a first inverter connected to the first capacitor; and
a fifth switch connected to input and output ends of the first inverter and configured to be turned on or turned off in response to the first control signal, and
wherein the second amplifier includes:
a second inverter connected to the second capacitor; and
a sixth switch connected to input and output ends of the second inverter and configured to be turned on or turned off in response to the first control signal.

6. The differential chopper comparator of claim 5, wherein the second chopper circuit includes:
a third amplifier and a fourth amplifier;
a third capacitor disposed between the first amplifier and the third amplifier and configured to charge via application of an output signal of the first amplifier; and
a fourth capacitor disposed between the second amplifier and the fourth amplifier and configured to charge via application of an output signal of the second amplifier.

7. The differential chopper comparator of claim 6, wherein the third amplifier includes:
a third inverter connected to the third capacitor; and
a seventh switch connected to input and output ends of the third inverter and configured to be turned on or turned off in response to the first control signal, and
wherein the fourth amplifier includes:
a fourth inverter connected to the fourth capacitor; and
an eighth switch connected to input and output ends of the fourth inverter and configured to be turned on or turned off in response to the first control signal.

8. The differential chopper comparator of claim 6, wherein the compensation circuit includes:
an eleventh switch having one end connected between the first amplifier and the third capacitor and another end connected between the second amplifier and the fourth capacitor, and configured to offset the first amplified signal and the second amplified signal in response to a fourth control signal; and
a twelfth switch having one end connected between the third capacitor and the third amplifier and another end connected between the fourth capacitor and the fourth amplifier, and configured to offset the first amplified signal and the second amplified signal in response to the fourth control signal.

9. The differential chopper comparator of claim 6, wherein the differential chopper circuit further includes a latch circuit configured to amplify the first amplified signal and the second amplified signal, and
wherein the latch circuit includes:
a ninth switch having one end connected to an input end of the third amplifier and another end connected to an output end of the fourth amplifier, and configured to amplify the first amplified signal and the second amplified signal in response to a third control signal; and
a tenth switch having one end connected to an input end of the fourth amplifier and the other end connected to an output end of the third amplifier, and configured to amplify the first amplified signal and the second amplified signal in response to the third control signal.

10. The differential chopper comparator of claim 9, wherein, while the first and fourth to eighth switches are turned off, the ninth to twelfth switches are turned on.

11. The differential chopper comparator of claim 1, wherein:
the at least one chopper circuit includes a first capacitor connected between a first one of the intermediate circuit points and the comparison circuit, and a second capacitor connected between a second one of the intermediate circuit points and the comparison circuit;
the first circuit path includes a first switch of the plurality of switches having a first end connected to a first end of the first capacitor, and having a second end connected to a first end of the second capacitor; and
the second circuit path includes a second switch of the plurality of switches having a first end connected to a second end of the first capacitor, and having a second end connected to a second end of the second capacitor.

12. A differential chopper comparator comprising:
an input terminal circuit configured to receive a first input signal and a second input signal and including a plurality of switches for selectively switching the first and second input signals to intermediate circuit points;
at least one chopper circuit connected to the intermediate circuit points and including at least first and second capacitors and a plurality of amplifiers which generate a first amplified signal and a second amplified signal;
a comparison circuit connected to the at least one chopper circuit and configured to compare the first amplified signal with the second amplified signal to output a first output signal and a second output signal in accordance with a result of the comparison; and
a compensation circuit including a first switch that shorts a first end of the first capacitor to a first end of the second capacitor during a first time period, and a second switch that shorts a second end of the first capacitor to a second end of the second capacitor during the first time period, to electrically couple the first amplified signal to the second amplified signal.

13. The differential chopper comparator of claim 12, wherein the at least one chopper circuit includes:
a first chopper circuit connected to the input terminal circuit; and
a second chopper circuit disposed between the first chopper circuit and the comparison circuit, and
wherein each of the first chopper circuit and the second chopper circuit includes a plurality of amplifiers.

14. The differential chopper comparator of claim 13, wherein the input terminal circuit includes:

a further switch disposed between a first input signal terminal and a first comparison node and configured to selectively transfer the first input signal to the first comparison node in response to a first control signal;

an additional switch disposed between the first input signal terminal and a second comparison node and configured to selectively transfer the first input signal to the second comparison node in response to a second control signal;

a third switch disposed between a second input signal terminal and the first comparison node and configured to selectively transfer the second input signal to the first comparison node in response to the second control signal; and a fourth switch disposed between the second input signal terminal and the second comparison node and configured to selectively transfer the second input signal to the second comparison node in response to the first control signal.

15. The differential chopper comparator of claim 14, wherein the first chopper circuit includes:

a first amplifier and a second amplifier;

a further capacitor disposed between the first comparison node and the first amplifier and configured to charge via application of the first input signal; and an additional capacitor disposed between the second comparison node and the second amplifier and configured to charge via application of the second input signal.

16. The differential chopper comparator of claim 15, wherein the first amplifier includes:

a first inverter connected to the first capacitor; and a fifth switch connected to input and output ends of the first inverter and configured to be turned on or turned off in response to the first control signal, and wherein the second amplifier includes:

a second inverter connected to the second capacitor; and a sixth switch connected to input and output ends of the second inverter and configured to be turned on or turned off in response to the first control signal.

17. The differential chopper comparator of claim 16, wherein the second chopper circuit includes:

a third amplifier and a fourth amplifier, wherein the first capacitor is disposed between the first amplifier and the third amplifier and configured to charge via application of an output signal of the first amplifier; and wherein the second capacitor is disposed between the second amplifier and the fourth amplifier and configured to charge via application of an output signal of the second amplifier.

18. The differential chopper comparator of claim 17, wherein the third amplifier includes:

a third inverter connected to the first capacitor; and a seventh switch connected to input and output ends of the third inverter and configured to be turned on or turned off in response to the first control signal, and wherein the fourth amplifier includes:

a fourth inverter connected to the second capacitor; and an eighth switch connected to input and output ends of the fourth inverter and configured to be turned on or turned off in response to the first control signal.

19. The differential chopper comparator of claim 17, wherein:

the first switch has one end connected between the first amplifier and the first capacitor and an opposite end connected between the second amplifier and the second capacitor, and is configured to offset the first amplified signal and the second amplified signal in response to a fourth control signal; and the second switch has one end connected between the first capacitor and the third amplifier and an opposite end connected between the second capacitor and the fourth amplifier, and is configured to offset the first amplified signal and the second amplified signal in response to the fourth control signal.

20. A memory device comprising:

a data storing unit;

a memory controller;

control logic; and a data input/output circuit configured to operate under control of the control logic to receive data from the data storing unit, generate a data signal corresponding to a clock and transmit the data signal to the memory controller;

wherein the data input/output circuit includes:

an input terminal circuit configured to receive a first input signal and a second input signal;

at least one chopper circuit configured to generate a first amplified signal and a second amplified signal by amplifying a difference between the first input signal and the second input signal;

a comparator configured to compare the first amplified signal with the second amplified signal, digitize a result of the comparison, and output a digital signal at a logic level; and a compensation circuit configured to offset the first amplified signal and the second amplified signal induced in the input terminal circuit, by selectively forming, via a plurality of switches, a plurality of circuit paths each coupling the first amplified signal to the second amplified signal at a same amplification stage, or each coupling the first input signal to the second input signal.

* * * * *